United States Patent [19]
Archer

[11] Patent Number: 5,534,814
[45] Date of Patent: Jul. 9, 1996

[54] HIGH INPUT IMPEDANCE GATE DRIVER CIRCUIT WITH MILLER PROTECTION AND DELAYED TURNOFF

[75] Inventor: Stephen T. Archer, Sunnyvale, Calif.

[73] Assignee: Ventritex, Inc., Sunnyvale, Calif.

[21] Appl. No.: 359,807

[22] Filed: Dec. 20, 1994

[51] Int. Cl.⁶ .................. H03K 17/687; H03K 17/72; H03B 1/00
[52] U.S. Cl. .................. 327/427; 327/434; 327/443; 327/108
[58] Field of Search .................. 327/108, 110, 327/190, 304, 387, 389, 391, 427, 434, 443; 361/91, 111, 118

[56] References Cited

U.S. PATENT DOCUMENTS

| | | | |
|---|---|---|---|
| 4,052,623 | 10/1977 | Loberg | 327/190 |
| 4,461,966 | 7/1984 | Hebenstreit | 327/190 |
| 5,023,471 | 6/1991 | Pauly | 327/190 |
| 5,027,018 | 6/1991 | Kindlmann et al. | 327/427 |
| 5,404,059 | 4/1995 | Löffer | 327/427 |
| 5,434,527 | 7/1995 | Antone | 327/391 |
| 5,438,294 | 8/1995 | Smith | 327/304 |
| 5,470,341 | 11/1995 | Kuehn et al. | 607/5 |

*Primary Examiner*—David C. Nelms
*Assistant Examiner*—Trong Phan
*Attorney, Agent, or Firm*—Steven M. Mitchell; Mark J. Meltzer

[57] ABSTRACT

A gate driver circuit includes a timing circuit, an anti-Miller surge protection circuit, and charging and discharging circuits for driving an output transistor, such as an IGBT. The anti-Miller surge protection circuit prevents the output transistor from being accidentally turned on. The gate driver circuit provides a high impedance input, so as to allow such a gate driver circuit to be driven by a relatively smaller isolation transformer. Further, the timing circuit in the gate driver circuit of the present invention allows such isolation transformer a relative lower frequency of operation. In one embodiment, the capacitance of the output transistor's gate terminal is used to determine the time constant of the timing circuit.

17 Claims, 5 Drawing Sheets

HIGH INPUT IMPEDANCE GATE DRIVER CIRCUIT WITH MILLER PROTECTION AND DELAYED TURNOFF

BACKGROUND OF THE INVENTION

1. Field of the Invention

The present invention relates to a high-voltage high-current circuit design; and, in particular, relates to the design of a driver circuit for a "high-side" switch.

2. Discussion of the Related Art

Transistors which operate under high voltages and deliver large currents are found in many applications. One such application is an implantable defibrillator, in which a large current is delivered to halt a ventricular fibrillation in a cardiac arrhythmia patient. In that application, a large voltage (e.g. up to 750 volts) is applied across the patient's heart, and two or more large current pulses (e.g. up to 50 A for 10 milliseconds (approx.) duration) of alternating polarities are provided to a patient suffering from ventricular fibrillation. For such a high-voltage high-current application, the output transistor delivering the current pulses can be provided, for example, by an insulated-gate bipolar transistor ("IGBT").

FIG. 1 shows a typical output circuit for such a defibrillator. As shown in FIG. 1, an "H-bridge" circuit 100 is provided to deliver currents in two directions (i.e. directions indicated by arrows 105 and 106 in FIG. 1) through a load 101. Load 101, in this application, is a human heart. H-bridge circuit 100 includes IGBT transistors 104a, 104b, 104c and 104d controlled respectively by gate driver circuits 102a, 102b, 103a and 103b. Gate driver circuits 102a and 102b are active to drive a current through transistors 104a and 104b in direction 105. Gate driver circuits 103a and 103b are active to drive a current through transistors 104c and 104d in direction 106.

In the prior art, each of gate driver circuits 102a, 102b, 103a and 103b can be implemented by a high current MOSFET driver, such as the HV400 High current MOSFET driver from Harris Corporation. FIG. 2 shows a unipolar gate driver output circuit 200 in the prior art, which includes a high current MOSFET driver integrated circuit 202 (e.g. HV400) driving the gate terminal of a high current MOSFET 201. Circuit 202 is, in turn, driven by the output terminals of an isolation transformer 203.

In FIG. 2, integrated circuit 202 provides transistors 206 and 207 for turning on and turning off transistor 201. When the voltage at terminal 208 rises above the voltage at terminal 231 by approximately two volts, transistor 206 turns on and charges the gate terminal of MOSFET 201, thereby turning on MOSFET 201. When the voltage at terminal 208 falls below terminal 233 by approximately 1 volt, transistor 207 is turned on which, in turn, triggers silicon-controlled rectifier (SCR) 205 to turn on also. SCR 205 rapidly discharges the charge at the gate terminal of MOSFET 201, and stops current from flowing into the base terminal of transistor 206, to shut off the current in MOSFET 201 and transistor 206. SCR 205 is shut off when its current falls below approximately 10 ma. At that point, resistors 209 and 230 discharge the remaining charge in the gate terminal of MOSFET 201.

One drawback of circuit 200 is the false triggering of SCR 205 under a number of circumstances. For example, if certain minimum off-time requirements are not met, a very fast negative going voltage at terminal 208 can trigger SCR 205 to turn on. Also, a rapid increase in the voltage at terminal 231 can trigger SCR 205 to turn on. When SCR 205 is triggered on, the current in MOSFET 201 is prematurely shut off. Such premature shut off of current in MOSFET 201 is undesirable, since the amount of current delivered by MOSFET 201 may be insufficient to achieve defibrillation.

Also, the large Miller capacitances in an output transistor, such as MOSFET 201 or an IGBT, can cause the output transistor to inadvertently switch on as a result of a sudden surge in drain-to-gate voltage at the output transistor. The resulting current in the output transistor can disrupt its proper operation and may lead to permanent damage to the output transistor.

Furthermore, the high current MOSFET driver circuit 202 turns off output transistor 201 in response to the voltage at input node 208 going low. Hence, the secondary winding of transformer 203 is required to sustain a positive pulse over the desired on-time for transistor 201. To achieve the desired on-time, the size of transformer 203 is constrained to be undesirably large.

SUMMARY OF THE INVENTION

In accordance with the present invention, a driver circuit and a method for driving a control terminal of an output transistor are provided. The driver circuit of the present invention includes: (a) a charging circuit for driving the control terminal of the output transistor to a high voltage level during an active phase ("charging phase") of a control signal to the driver circuit; (b) a surge protection circuit ("Anti-Miller protection circuit"), coupled to the charging circuit and the control terminal, for preventing a surge in voltage in the control terminal (e.g. a sharp rise in voltage due to Miller capacitance at the turn-on of the opposite phase of the "H" bridge) from resulting in an inappropriate turn on of the controlled switch, and (c) a discharging circuit for discharging the control terminal to a reference voltage source (e.g. a common ground voltage), when the charging current is turned off.

In one embodiment, the driver circuit of the present invention includes a timing circuit, which turns on the discharging circuit after a time period following the charging phase. The time constant of the timing circuit can be set either by a capacitor (e.g. an on-chip capacitor), or by a combination of the input capacitance of the power switch and the capacitance of the Anti-Miller protection circuit. The discharging circuit can be triggered by diverting the current from a capacitor in the timing circuit to activate a switch to turn on the discharging circuit.

In one embodiment, the Anti-Miller protection circuit is formed by a discharging transistor coupled between the gate terminal of the output transistor and the common ground voltage. The Anti-Miller protection works by actively clamping the gate voltage of the output transistor to common unless the output transistor is turned on by charge coming through the proper gate driver input.

In one application, the driver circuit of the present invention is driven from a secondary winding of an isolation transformer. The isolation transformer allows the gate driver circuit to generate a differential gate drive that is isolated from circuit ground. Thus, the gate driver can be used to drive a "high side" switch without itself standing off high voltage.

In one embodiment, a zener diode is provided between the gate terminal of the output transistor and the common ground voltage source to limit the gate terminal of the output transistor to less than a predetermined voltage above the common (source) voltage.

The timing circuit in the gate driver circuit of the present invention allows a charge to be maintained for a relatively long period in the gate terminal of the output transistor and then provides a rapid discharge of the gate terminal of the output transistor. Thus, the isolation transformer can be operated at a lower frequency and duty cycle than in the prior art, thereby resulting in a correspondingly lower power operation.

The gate driver circuit of the present invention provides protection against a voltage surge resulting from the Miller capacitance of the output transistor. Such protection prevents the output transistor from being inadvertently turned on, thereby avoiding a possible irreversible damage to the output transistor as a result of the inadvertent turning on of the output transistor.

The gate driver circuit of the present invention presents a high impedance input to an isolation transformer, thus minimizing the amount of energy required to be coupled by the transformer to the gate driver circuit. Consequently, a smaller isolation transformer can be used in conjunction with the present invention. Such smaller isolation transformer represents a space efficiency over corresponding isolation transformers of the prior art. The gate driver circuit of the present invention does not require a quiescent power supply. The gate driver circuit of the present invention may be implemented in an integrated circuit.

The present invention is better understood upon consideration of the detailed description provided below and the accompanying drawings.

DETAILED DESCRIPTION OF THE PREFERRED EMBODIMENT

The present invention provides a gate driver circuit to drive a power switch or an output transistor. Such a gate driver circuit includes an internal timing circuit, a protection circuit to hold the output transistor (e.g. an IGBT) in the "off state" despite voltage surges resulting from the Miller capacitance of the output transistor, a charging circuit for the gate terminal of the output transistor and a discharging circuit for the gate terminal of the output transistor.

Figure 3:
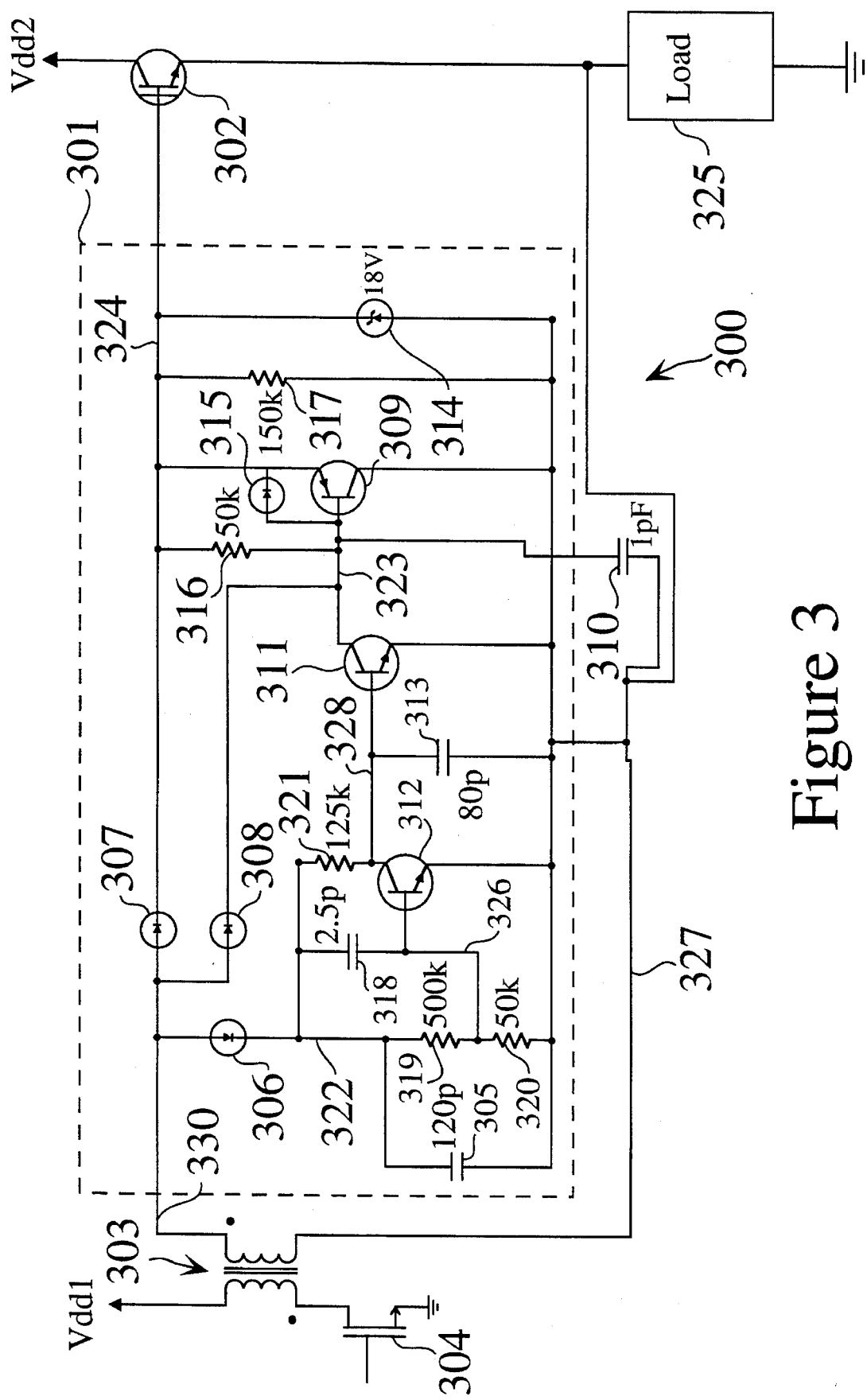
FIG. 3 is a schematic diagram of a circuit 300 of the present invention.

FIG. 3 is a schematic diagram of a circuit 300 of the present invention. As shown in FIG. 3, a driver circuit 301 for IGBT 302 is coupled to the secondary windings of an isolation transformer 303, which is controlled by a field effect transistor (FET) 304 (e.g. an N-MOSFET). In this embodiment, driver circuit 301 can be implemented as an integrated circuit. Gate driver circuit 301 operates to charge node 324 at the gate terminal of IGBT 302, so as to switch IGBT 302 to a conducting state. In the conducting state of IGBT 302, a large current is delivered to load 325. To achieve this purpose, FET 304 is cycled on and off, so that diodes 306, 307 and 308 are alternately in the conducting and non-conducting states to provide charging current pulses through diodes 306–308.

Initially, all electrical nodes are at the common voltage of node 327. Thus, if the charge in a Miller capacitor of IGBT 302 causes the voltage on node 324 to rise above approximately 0.7 volts, then PNP transistor 309 turns on. Capacitor 310 maintains PNP transistor 309's conducting state.

To turn on IGBT 302, FET 304 is turned on and then off. When FET 304 is turned off, the voltage at node 330 "flies back" (i.e. rises), thereby switching on diodes 306, 307 and 308 to charge node 324 and capacitors 305, 318 and 310. The rising voltages at node 324 and capacitors 305, 318 and 310 are provided to turn on NPN transistor 312 and IGBT 302, and to turn off PNP transistor 309 and NPN transistor 311. When the voltage at terminal 324 reaches IGBT 302's threshold voltage, IGBT 302 is turned on to deliver a large current to load 325. In this embodiment, circuit 300 is provided in a defibrillator, so that load 325 is normally a human heart in fibrillation.

The charging current through diode 306 provides a high voltage at node 326, which is coupled to the base terminal of transistor 312, thereby turning on NPN transistor 312. Conducting transistor 312 keeps both capacitor 313 discharged and NPN transistor 311 in the non-conducting state. Simultaneously, the charging current in diode 308 brings the voltage at terminal 323 to a high voltage, thereby keeping PNP transistor 309 in the non-conducting state. Zener diode 314 protects IGBT 302 from damage by preventing the voltage at the gate terminal of IGBT 302 (i.e. node 324) from rising above 18 volts. Likewise, diode 315 protects PNP transistor 309 from damage by preventing a reverse-biased base-emitter junction.

After FET 304 is switched off, the voltages at node 322 (i.e. across capacitor 305) and node 324 at the gate terminal of IGBT 302 begin to decay. The time constant of voltage decay at node 322 is determined primarily by the values of capacitor 305, and resistors 319, 320, and 321. In this embodiment, the capacitance of capacitor 305 is chosen to be 120 pF, and the resistances of resistors 500 K ohms, 50 K ohms and 125 K ohms, respectively. Capacitor 318, which has a capacitance of 2.5 pF in this embodiment, has an insignificant effect on the time constant of the voltage decay at node 322. The time constant of the voltage decay at node 324 at the gate terminal of IGBT 302 is determined by the size of capacitor 310 and resistors 317 and 316 and the gate capacitance of IGBT 302. In this embodiment, capacitor 310 is chosen to have a capacitance of 1 nF, and the resistances of resistors 316 and 317 are chosen to be 50 K ohms and 150 K ohms, respectively. Clearly, the rate of voltage decay at node 322 is much faster than the rate of decay at node 324 at the gate terminal of IGBT 302. One of ordinary skill in the art would appreciate that other capacitance and resistance values can also be used for the capacitors and resistors discussed above, provided their relative sizes are approximately maintained.

When the voltage at node 322 falls sufficiently, transistor 312 turns off. As a result, the voltage on capacitor 313 is allowed to rise. Charge sharing between capacitor 305 and capacitor 313 leads to a rise in voltage at node 328 sufficient to switch on NPN transistor 311. Transistor 311 discharges capacitor 310 to switch on transistor 309, which rapidly discharges node 324 at the gate terminal of IGBT 302 to switch off IGBT 302. Because the voltage at node 324, i.e. at the gate terminal of IGBT 302, is maintained at a relatively high level until transistor 311 switches on, the frequency by which FET 304 is driven to maintain IGBT 302 in the conducting state is lowered. As a result, the total power requirement of the gate driver circuit 301 is lowered, as compared to gate deliver circuits of the prior art. Once transistor 309 is switched on, IGBT 302 is rapidly shut off. Consequently, the stress on IGBT 302 resulting from a slow turn-off of the IGBT is minimized.

Figure 4:
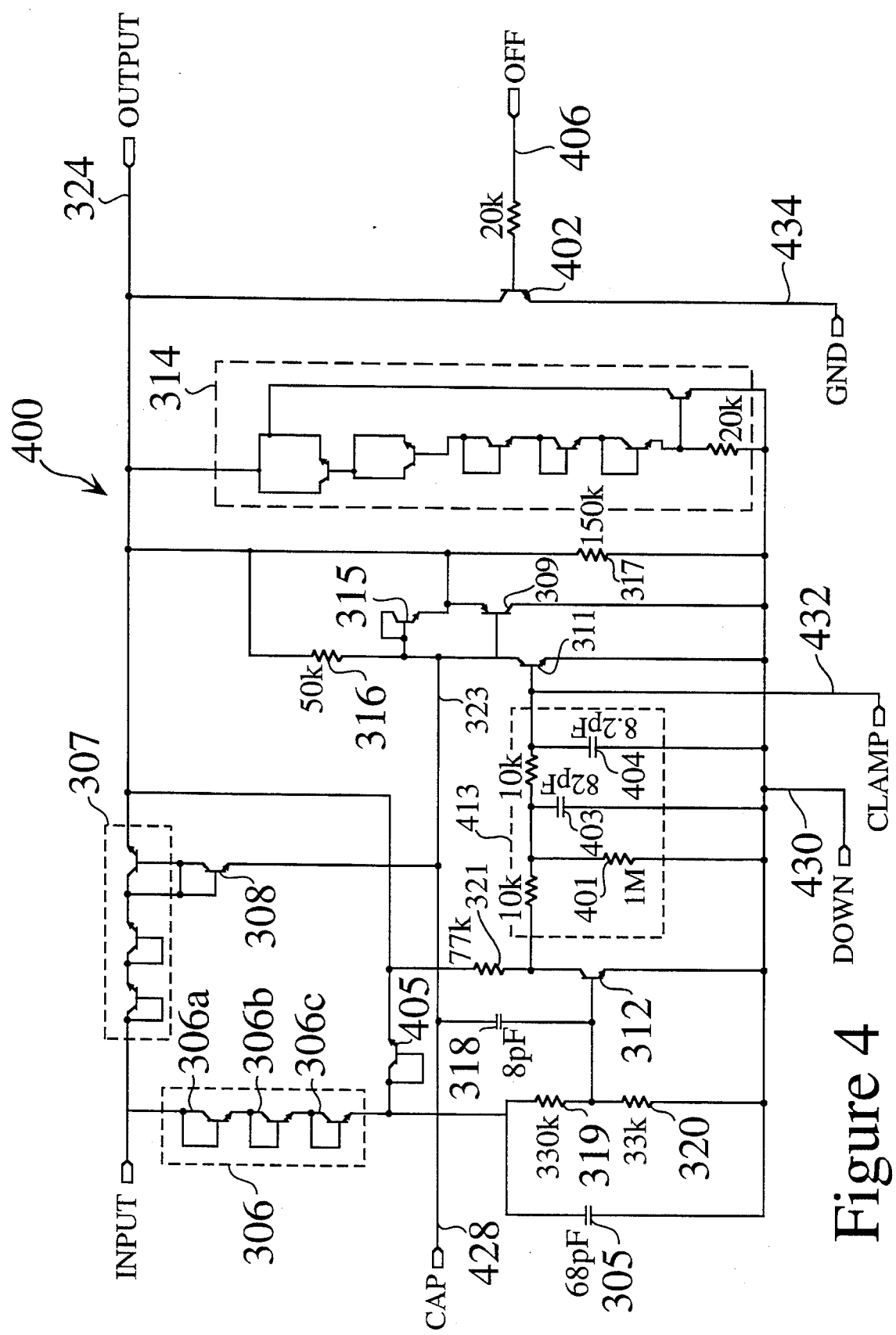
FIG. 4 is a schematic diagram of an integrated circuit implementation of gate driver circuit 400, in a second embodiment of the present invention.

FIG. 4 is a schematic diagram of gate driver circuit 400, in a second embodiment of the present invention. In this second embodiment, capacitor 310 (not shown) is provided as a capacitor external to gate driver circuit 400. Capacitor 310 can be provided as an off-chip capacitor coupled between node 323 and the common ground voltage at terminal 430. To facilitate comparisons between FIGS. 3 and 4, elements in FIG. 4 which correspond to elements in FIG. 3 are provided the same reference numerals as their counterparts in FIG. 3. For example, in FIG. 4, the serially connected diodes 306a–306c, collectively labeled 306, correspond diode 306 of FIG. 3. Likewise, the structure enclosed in box 314 of FIG. 4 corresponds to zener diode 314 of FIG. 3. In FIG. 4, capacitor 313 is replaced by the structure enclosed in the box labeled 413, which includes resistor 401, and capacitors 403 and 404. Structure 413 plays substantially the same role in switching on transistor 311 slowly following the switching off of transistor 312. In gate driver circuit 400 of FIG. 4, an additional diode 405 is provided for discharging capacitor 305 when transistor 309 is switched on to discharge node 324 at the gate terminal of IGBT 302. Gate driver circuit 400 of FIG. 4 also provides an NPN transistor 402 to discharge node 324, upon activation by a control signal "off" at terminal 406. This feature is useful if the gate driver circuit is used in a "low-side" application. Since the operation of gate driver circuit 400 is substantially the same as that of circuit 301, a detailed description of gate driver circuit 400's operation is therefore omitted.

[1]The resistances and capacitance values of elements in gate driver circuit 400 are different from the corresponding elements in gate driver circuit 301 of FIG. 3, due to manufacturing considerations. However, the relative resistances and capacitances of elements in each of circuits 301 and 400 are substantially maintained.

Figure 1:
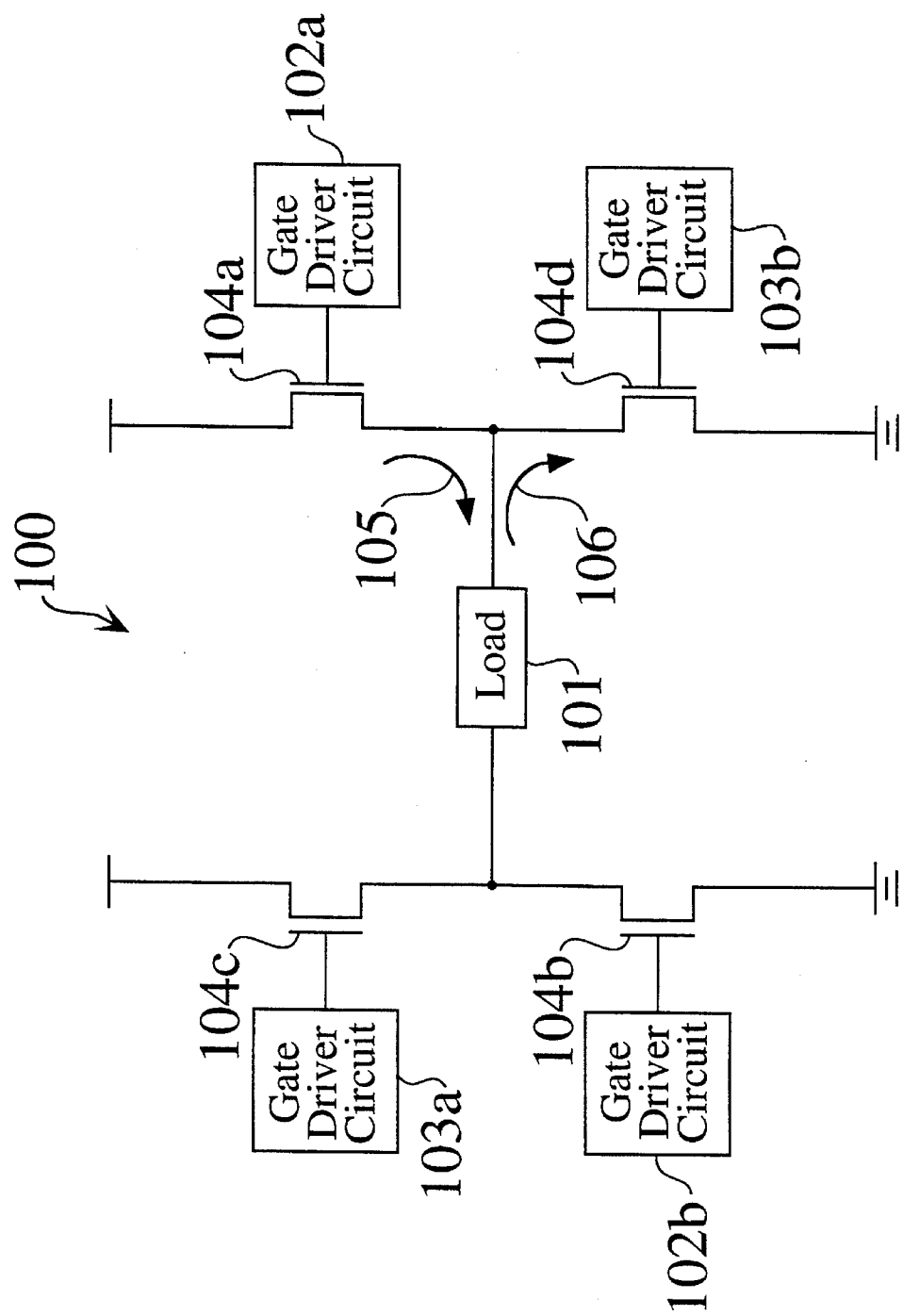
FIG. 1 shows a typical output circuit 100 for use in a defibrillator application.
Figure 2:
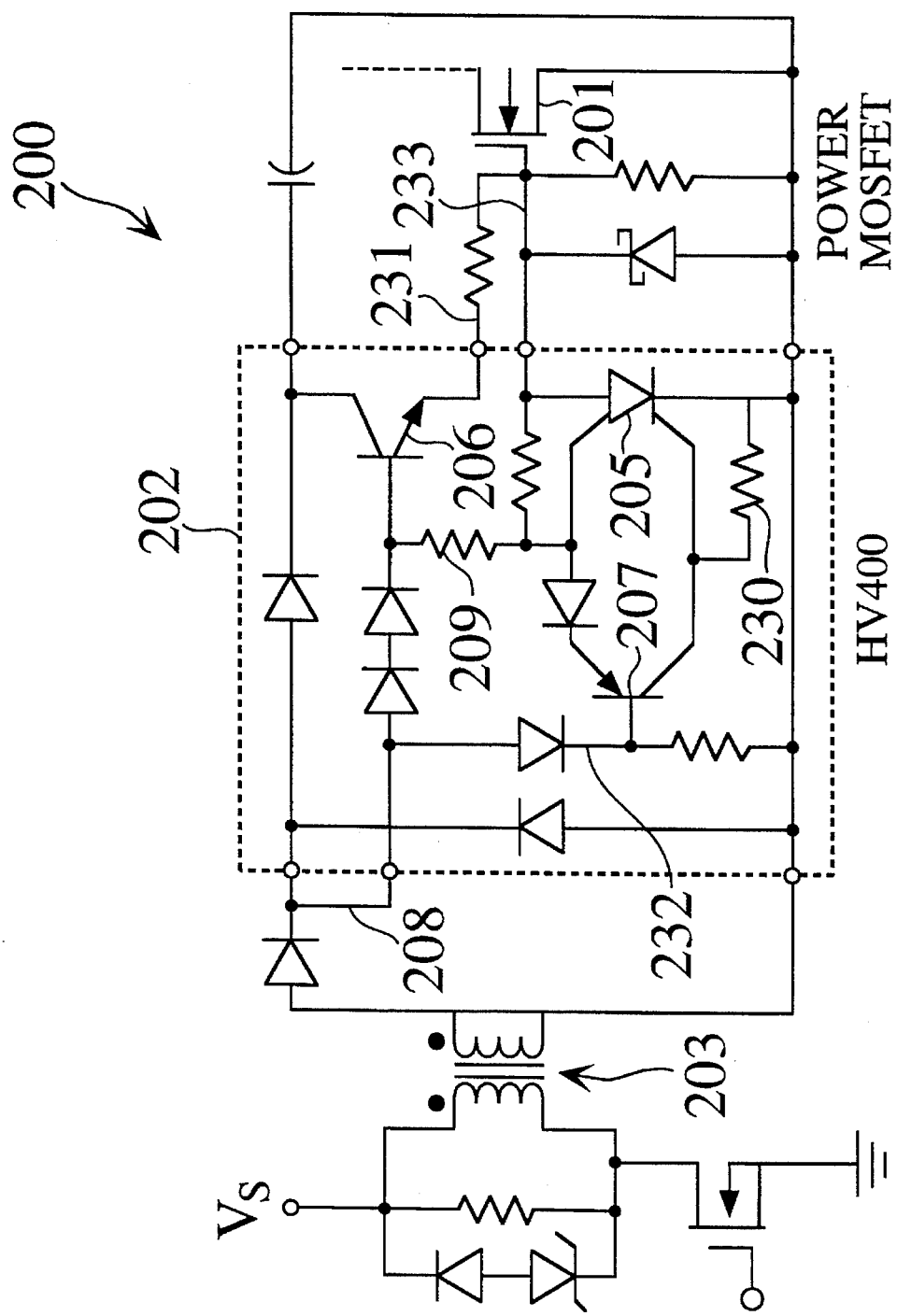
FIG. 2 shows a unipolar drive output circuit 200 in the prior art, which includes MOSFET 201.

When the gate driver circuit of the invention is used in a defibrillator which has biphasic waveform capability such as the one shown in FIG. 1, the IGBT transistors are arranged in an H-bridge to provide the capability of alternating the direction of current flow through the heart. In that case, the gate driver circuit of the invention is used somewhat differently for the high side transistors 104a and 104c which are connected between the high voltage capacitor bank and the heart and the low side transistors 104b and 104d which are connected between the heart and ground. For the high side transistors, the turn off of the transistor (IGBT 302) is controlled by the time constant of the gate driver circuit when FET 304 discontinues cycling. This time is about 50 microseconds. When the circuit of FIG. 4 is used as a gate driver circuit for a high side transistor, the "off" terminal 406, clamp terminal 432 and ground terminal 434 are allowed to float and the turn off of IGBT 302 is controlled by the gate driver circuit time constant. A common terminal 430 is tied to the emitter of IGBT 302. However, it is desirable to have the high side transistor turn off (open) before the low side transistor turns off. When the circuit is used for the low side transistors, the common terminal 430 is connected to clamp terminal 432 and ground terminal 434 which are also tied to circuit ground. Off terminal 406 receives a voltage under logic control to turn the output transistor off by discharging node 324 under logic control.

This allows for an additional delay of about 50 microseconds before node 324 is discharged by the "off" control signal at terminal 406.

Figure 5:
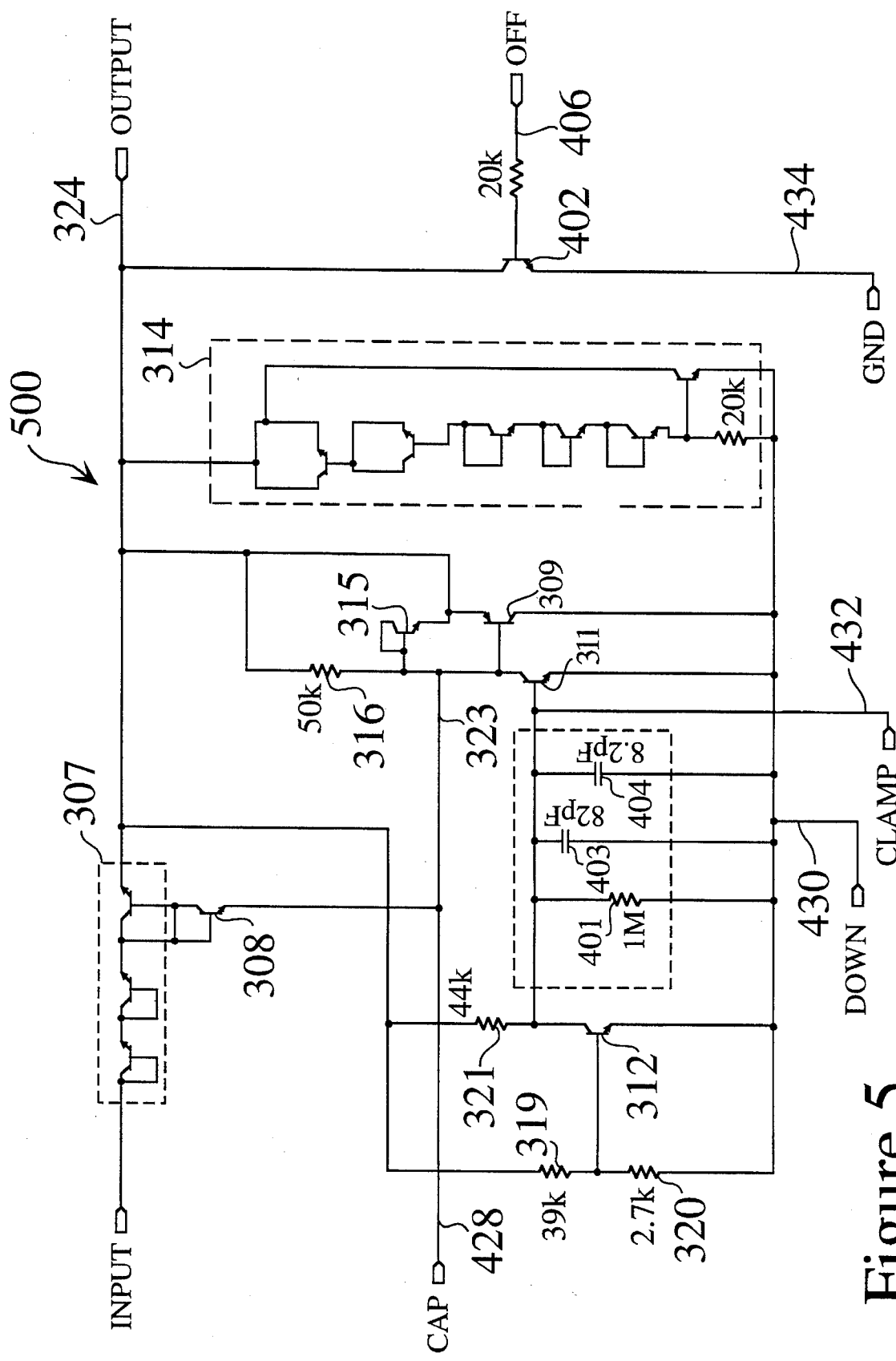
FIG. 5 is a schematic diagram of an integrated circuit implementation of gate driver circuit 500, in a third embodiment of the present invention.

FIG. 5 is a schematic diagram of an integrated circuit implementation of gate driver circuit 500, in accordance with a third embodiment of the present invention. Again, to facilitate comparisons among gate driver circuits 301, 400 and 500, corresponding elements in FIGS. 3, 4 and 5 are provided the same reference numerals. In place of timing capacitor 305 of gate driver circuits 301 and 400, gate driver circuit 500 relies upon the capacitance of the gate terminal of IGBT 302 to provide, in conjunction with capacitor 310 and resistors 319, 320, 321, 317 and 401, the time constant of voltage decay used to control the timing of the discharge of node 324. Hence, gate driver circuit 500 occupies a smaller silicon area than circuit 400 and the delay before turnoff can be augmented by the addition of a capacitor between node 324 and node 430. An additional benefit of the embodiment in FIG. 5 is achieved in gate driver circuit 500 because IGBT 302 is turned off in response to IGBT 302's gate voltage. When node 324 discharges such that the gate-emitter voltage of IGBT 302 reaches the point that IGBT 302 enters into a linear region of operation, where damage to the IGBT 302 can occur, IGBT 302 is switched off. In one implementation of this embodiment, such a linear region is reached when the gate-emitter voltage of IGBT 302 is approximately 8 volts.

Since the qualitative operation of gate driver circuit 500 is substantially the same as that of gate driver 300, a detailed description of gate driver circuit 500 is also omitted.

The above detailed description is provided to illustrate the specific embodiments of the present invention and is not intended to be limiting. Many modifications and variations within the scope of the present invention are possible. The present invention is defined by the following claims.

I claim:

1. A driver circuit for driving a control terminal of an output transistor, said output transistor being in a conducting state when said control terminal is at a first voltage level and in a non-conducting state when said control terminal is at a second voltage level, said driver circuit receiving a control signal having an active phase and an inactive phase, said driver circuit comprising:

a charging circuit receiving said control signal for driving said control terminal to said first voltage level during said active phase of said control signal;

a surge-protection circuit, coupled to said charging circuit and said control terminal, for preventing a surge in voltage in said control terminal that occurs at other than the active phase, said surge protection circuit being disabled during said active phase of said control signal to allow normal operation; and a discharging circuit, receiving said control signal and coupled to said control terminal, for driving said control terminal to said second voltage level following a predetermined delay, during said inactive phase of said control signal.

2. A driver circuit as in claim 1, said discharging circuit having an enable terminal, said discharging circuit being in a non-conducting state upon receiving at said enable terminal an active phase of said control signal, said driver circuit further comprising a timing circuit, receiving said control signal and coupled to said enable terminal, for providing said predetermined delay following said active phase of said control signal.

3. A driver circuit as in claim 2, wherein said timing circuit has a time constant determined by a capacitor coupled to said driver circuit.

4. A driver circuit as in claim 2, wherein said timing circuit has a time constant determined by the capacitance at said control terminal.

5. A driver circuit as in claim 2, wherein said timing circuit comprises a capacitor, said capacitor being charged by a charging current from said control signal to a predetermined voltage during said active phase of said control signal, said timing circuit providing said predetermined delay by a decay of said predetermined voltage on said capacitor to trigger said discharge circuit after said predetermined delay following said control signal going inactive.

6. A driver circuit as in claim 1, wherein said surge protection circuit comprises:
   a capacitor, coupled to said charging circuit, such that a voltage across said capacitor reaches from a third voltage level to a fourth voltage level during said initial portion of said active phase of said control signal; and
   a transistor, coupled to receive said voltage across said capacitor, said transistor being in a conducting state when said voltage is between said third and fourth voltage levels, and in a non-conducting state at said fourth voltage level.

7. A driver circuit as in claim 1, said driver circuit being coupled to receive said control signal from a secondary winding of an isolation transformer, said charging circuit comprising diodes for isolation of said control terminal, said timing circuit and said surge protection circuit during said inactive phase of said control signal.

8. A driver circuit as in claim 1, wherein said discharging circuit comprises a transistor for coupling said control terminal to a reference voltage source.

9. A driver circuit as in claim 1, further comprising a zener diode between said control terminal and a reference voltage source for limiting said control terminal to a voltage less than a predetermined voltage above a voltage of said reference voltage source.

10. A method for driving a control terminal of an output transistor in accordance with a control signal, said control signal having an active phase and an inactive phase, said output transistor being in a conducting state when said control terminal is at a first voltage level and in a non-conducting state when said control terminal is at a second voltage level, said method comprising the steps of:
   coupling a surge-protection circuit to a charging circuit and said control terminal for preventing a surge in voltage in said control terminal, said surge protection circuit being disabled during said active phase of said control signal;
   charging said control terminal to said first voltage level during said active phase of said control signal; and
   discharging said control terminal to said second voltage level, during said inactive phase of said control signal.

11. A method as in claim 10, said step of discharging being initiated upon receiving an active phase of said control signal, said method further comprising the step of providing a timing circuit for providing a predetermined delay following said active phase of said control signal.

12. A method as in claim 11, wherein said timing circuit has a time constant determined by a capacitance at said control terminal.

13. A method as in claim 12, wherein said step of providing a timing circuit comprises the step of coupling a capacitor to be charged by said step of charging during said active phase of said control signal, said timing circuit providing said predetermined delay by allowing the charge from said capacitor to decay during said predetermined delay.

14. A method as in claim 10, wherein said step of coupling said surge protection circuit comprises the steps of:
   coupling a capacitor to receive a charging current of said step of charging, such that a voltage across said capacitor rises from a third voltage level to a fourth voltage level during said initial portion of said active phase of said control signal; and
   coupling a transistor to receive said voltage across said capacitor, said transistor being in a conducting state when said voltage is between said third and fourth voltage levels, and in a non-conducting state at said fourth voltage level.

15. A method as in claim 10, wherein said control signal is provided by a secondary winding of an isolation transformer, and said step of charging comprises the steps of isolating said control terminal, said timing circuit and said surge protection circuit during said inactive phase of said control signal.

16. A driver circuit as in claim 10, wherein said step of discharging couples a conducting transistor between said control terminal and a reference voltage source.

17. A method as in claim 10, further comprising the step of coupling a zener diode between said control terminal and a reference voltage source to limit said control terminal to a voltage less than a predetermined voltage above a voltage of said reference voltage source.

* * * * *